United States Patent [19]

Bellino et al.

[11] Patent Number: 5,943,219
[45] Date of Patent: *Aug. 24, 1999

[54] SYSTEM FOR PROVIDING AIR FLOW CONTROL AND EMC SHIELDING OF FRONT PANELS OF COMPUTERS AND SIMILAR ELECTRONIC EQUIPMENT

[75] Inventors: Richard Anthony Bellino, Carol Stream; Thomas Earl Bowers, Warrenville; William Thomas Harrison, Naperville, all of Ill.; William Joseph Harvey, Hoboken, N.J.; Paul Edwin Maass, Naperville, Ill.; Joel Everett Miller, Aurora, Ill.; Reynaldo Olinares Miran, Downers Grove, Ill.

[73] Assignee: Lucent Technologies Inc., Murray Hill, N.J.

[*] Notice: This patent issued on a continued prosecution application filed under 37 CFR 1.53(d), and is subject to the twenty year patent term provisions of 35 U.S.C. 154(a)(2).

[21] Appl. No.: 08/833,809

[22] Filed: Apr. 9, 1997

Related U.S. Application Data

[63] Continuation-in-part of application No. 08/549,579, Oct. 27, 1995, abandoned.

[51] Int. Cl.⁶ .................................................... H05K 7/20
[52] U.S. Cl. ...................... 361/816; 174/35 GC; 361/704
[58] Field of Search .................................. 174/35 R, 51, 174/35 GC; 165/122, 126, 80.3; 454/184; 49/489.1, 496.1, 498.1, 501; 455/300; 277/178, 226, 901, 647, 919, 920; 361/212, 220, 690–695, 729, 730, 736, 752, 796, 799, 800, 801, 816, 818, 802, 725, 727; 211/26, 41.17

[56] References Cited

U.S. PATENT DOCUMENTS

| | | | |
|---|---|---|---|
| 3,904,937 | 9/1975 | Levin | 317/120 |
| 4,872,212 | 10/1989 | Roos | 361/424 |
| 5,045,635 | 9/1991 | Kaplo | 174/35 GC |
| 5,202,536 | 4/1993 | Buonanno | 174/35 GC |
| 5,289,347 | 2/1994 | McCarthy | 361/609 |
| 5,388,995 | 2/1995 | Rudy, Jr. | 439/61 |
| 5,504,657 | 4/1996 | Stocco | 361/800 |
| 5,545,845 | 8/1996 | Flores | 174/35 R |

FOREIGN PATENT DOCUMENTS

| 4-120798 | 4/1992 | Japan | 361/818 |
|---|---|---|---|

*Primary Examiner*—Gerald Tolin
*Attorney, Agent, or Firm*—Michael B. Johannesen; Neil R. Ormos

[57] ABSTRACT

A circuit card face plate with an elastomeric, electrically-conductive seal that provides electromagnetic compatibility sealing and air flow control for a front panel of an electronic equipment frame. The seal gasket is in electrically-conductive contact with the face plate and an adjacent face plate, thus, with all cards in place, an air flow barrier and an electrically-conductive surface is established. To this end, an elastomeric, electrically conductive seal in a modified figure-eight cross-section provides a close fit with minimal lateral pressure being exerted on adjacent cards. Further a pin on both the top and the bottom of the face plate inserts into a hole on an upper and lower rack shelf maintain alignment of the cards when they are in the frame.

11 Claims, 6 Drawing Sheets

SYSTEM FOR PROVIDING AIR FLOW CONTROL AND EMC SHIELDING OF FRONT PANELS OF COMPUTERS AND SIMILAR ELECTRONIC EQUIPMENT

CROSS-REFERENCE TO RELATED APPLICATION

This application is a continuation-in-part of application Ser. No. 08/549,579, filed on Oct. 27, 1995, now abandoned.

This application is related to F. C. Stocco, et al., U.S. Pat. No. 5,504,657, which issued Apr. 2, 1996.

TECHNICAL FIELD

This invention relates to the field of shielding electronic equipment frames and, more specifically, to the area of electromagnetic compatibility (EMC) shielding and air flow control of front panels of such electronic equipment frames.

BACKGROUND OF THE INVENTION

Large electronic equipment generally comprises a plurality of circuit cards which make up the functional components of the equipment. Each of these circuit cards is plugged into a panel or backplane which provides the communication lines among the various circuit cards. In order to mechanically house and hold these cards in place, cabinets called "frames" have been used for many years.

FIG. 1 shows a typical frame for such circuit cards. Frame 100 has two metal sides 102, 104, and a metal top 106, floor 108, and back 110. The interior of this cabinet is subdivided into a plurality of shelves 112. Each shelf includes a number of plug-in card slots, which are then wired together on the backplane. Each shelf holds one or more circuit cards 114, depending upon the application. In the example of FIG. 1, there are power circuits 116 at the bottom of the frame and therefore very few circuits per shelf on the bottom. Alternatively, there are many circuit packs on the upper shelves.

Each circuit pack has a face plate 120, or stiffener, connected perpendicularly to the circuit pack on the end opposite the backplane. These face plates are commonly made of an electrically conductive metal such as aluminum to serve several functions. These face plates primarily serve as stiffeners to hold the circuit cards in a vertical orientation and keep them from flexing. Further, they provide a handle or grasping means to facilitate maintenance personnel removing and inserting the circuit cards. These face plates may also be used as a support for switches, labels, lights (i.e., system status, on/off, etc.) and other information (such as name or number of packs, etc.) regarding the state or condition of the circuit on the circuit card. It is currently standard in the art to provide gaps between the face plates on a particular shelf. These gaps allow easy insertion and removal of the circuit cards. Not having such gaps makes removal and insertion difficult, and greatly reduces tolerances for the backplane and the rack mounts of the circuit cards.

These gaps between the face plates, however, permit leakage of cooling air, electromagnetic radiation (EMR) both into and out of the cabinet, and electrostatic discharge (ESD). In order to meet standards for electromagnetic compatibility (EMC) from the front of a frame, prior art frames are equipped with a door 121. The circuit cards require thermal control which is normally provided by continuous air flow, and door 121 promotes air circulation by sealing the front of the frame. It is common to use large fans 122 at the bottom of a frame in order to circulate air up through the frame to an outlet 123 on top and thus cool it. For clarity, only a single fan is shown, but commonly a number are used. If air leaks through the front panel, as illustrated by the arrows 124, such cooling efficiency is greatly reduced. As well as adding cost and taking up valuable space, door 121 impedes access to circuit packs, because door 121 must be closed to maintain EMC compliance and thermal operating standards.

An objective is, therefore, to provide an electromagnetic radiation and susceptibility shield and air flow containment for thermal control without having to resort to a door.

SUMMARY OF THE INVENTION

This problem is solved and a technical advance is achieved in the art by a new configuration of circuit card face plates with an elastomeric, electrically-conductive seal that provides electromagnetic compatibility and air flow control for a front panel of an electronic equipment frame. The metallic face plate has a plurality of edge surfaces which are capable of providing an electrically conductive contact with the frame when inserted, wherein one of the edge surfaces holds the seal. The seal is in electrically-conductive contact with the face plate and an adjacent face plate, thus, with all cards in place, an air flow barrier and an electrically-conductive surface is established. In this manner, the entire face plate is electrically conductive and connected to the frame, forming a ground plane which provides a shield for electromagnetic radiation. Furthermore, the elastomeric seal provides a barrier against significant air leakage from between adjacent face plates. This air barrier enhances thermal control and is referred to herein as a "thermal seal."

It is a further object of this invention to maintain alignment of the circuit cards and face plates when they are inserted into the shelf using this invention. To this end, an elastomeric, electrically conductive seal in a modified figure-eight cross-section provides a good fit with minimal lateral pressure being exerted on adjacent cards. Further, a pin on both the top and the bottom of the face plate inserts into a hole on an upper and lower rack shelf, maintaining alignment of the cards when they are in the frame.

BRIEF DESCRIPTION OF THE DRAWINGS

A more complete understanding of the invention may be obtained from a consideration of the following description in conjunction with the drawings, in which.

DETAILED DESCRIPTION

Figure 1:
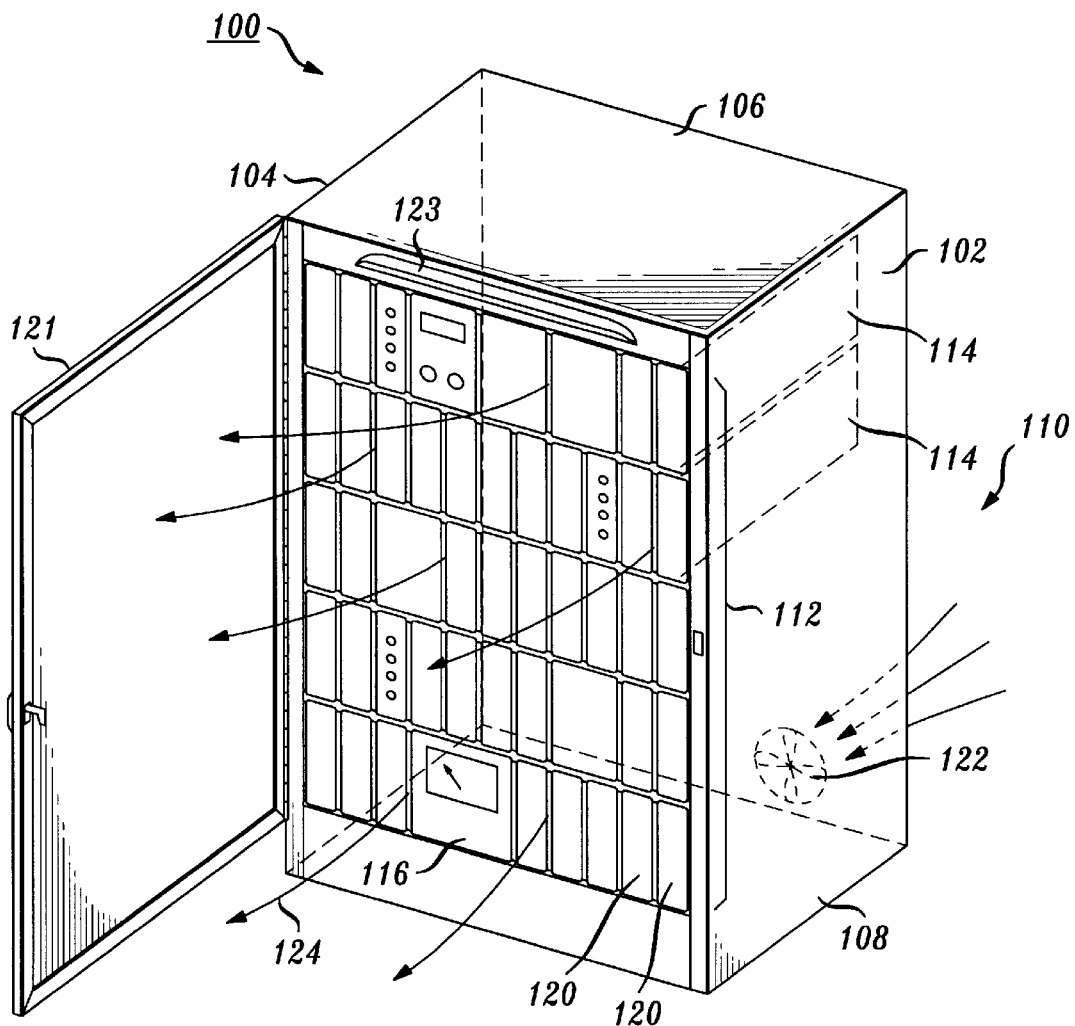
FIG. 1 is an illustration of a prior art circuit card frame or cabinet.
Figure 2:
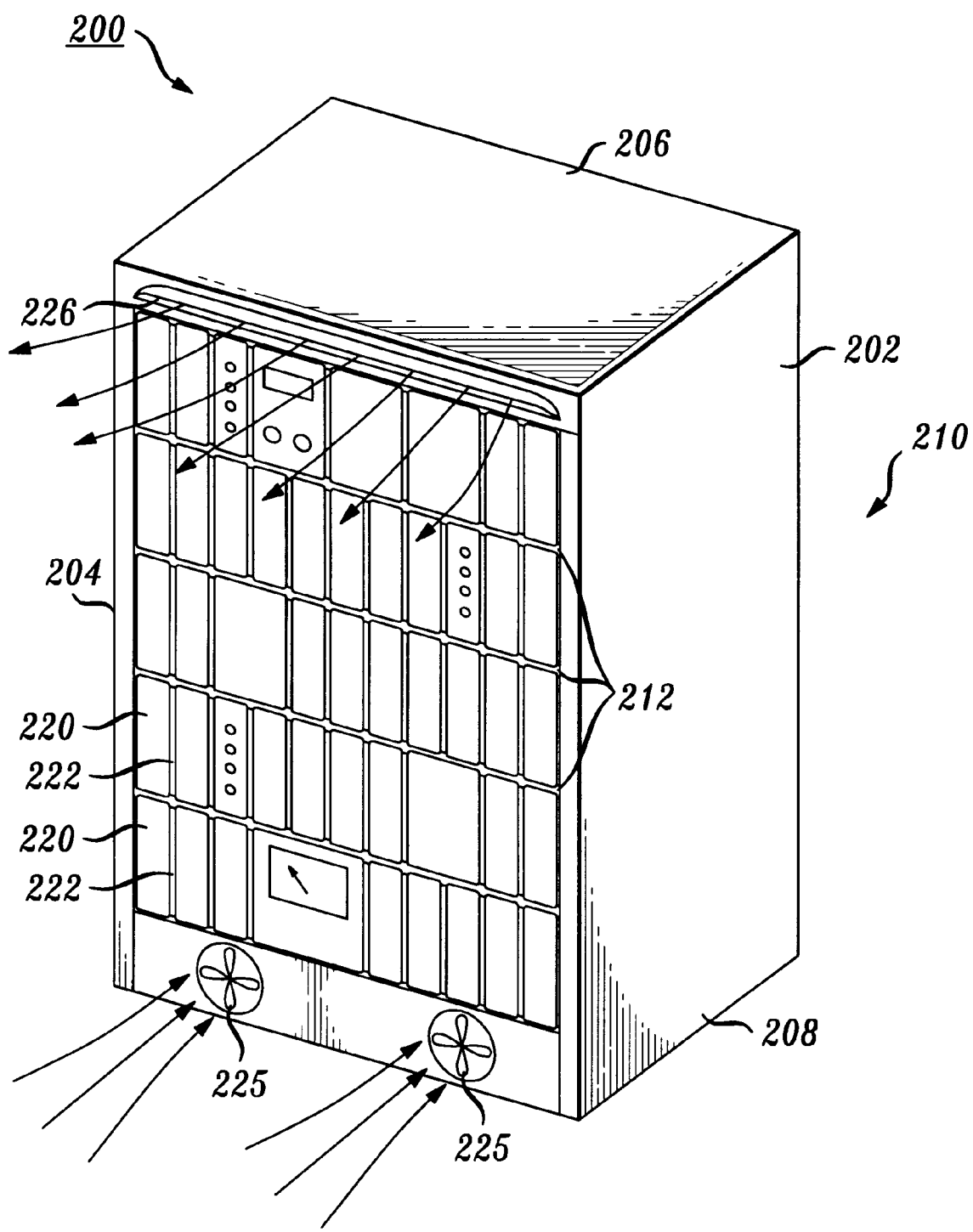
FIG. 2 is an illustration of a frame which employs an exemplary embodiment of this invention.

FIG. 2 shows an electronic equipment frame 200 in which an exemplary embodiment of this invention is illustrated. As in the prior art, frame 200 comprises two metal sides 202, 204, and a metal top 206, bottom 208 and backplane 210. Circuit cards are arranged on a plurality of shelves or racks 212. As opposed to the teaching of the prior art, however, there is no need for a door. There is, instead, a plurality of electronically conductive face plates 220 with an electrically conductive, elastomeric seals 222 between them in order to provide EMC shielding and air flow control. According to an exemplary embodiment of this invention, each front panel 220 is designed to fit precisely into frame 200 between shelves 212 so that there is a fairly close tolerance between front panels. The gap between front panels is, as will be described in more detail below, filled with a seal 222 comprising a conductive, elastomeric material. As a result, the front of each shelf 212 is conductive (i.e., 0 resistance) from one end to the other. Such conductivity provides an effective shield for electromagnetic compatibility (EMC) thus providing a system capable of meeting EMC standards without having to resort to a door. The conductive shelf front, which is in contact with face plates 220, provides a path for static discharges to be safely discharged to the frame ground. Furthermore, frame 200 is effectively air sealed by the seals filling in the spaces between face plates so that air intake through fans 225 is then conducted up through the cards and out exhaust port 226 providing more efficient and thus a calculable level of cooling through frame 200.

In this embodiment of this invention, a "seal" is used, not a "gasket". A "gasket" implies a filler that is held in place under pressure, such as when two pieces of metal are bolted together (e.g., the cylinder heads of an internal combustion engine are bolted to the engine block with a gasket therebetween, in order to prevent leaks). In contrast, a "seal", as used in this patent (and generally in the art) is under little or no pressure; a seal performs its task by the nature of the material selected for the seal, and the geometric shape of the seal.

In the current application, it is important that the seal be elastomeric, and also that the elastomeric material be entirely impregnated with electrically conductive particles. The conductive nature of such a seal ensures that an electrically conductive seal is made without the need to ensure integrity of a coating (as in layered seals) and without pressure to ensure electrical conductivity. Thus, the seal according to this invention is elastomeric and electrically conductive throughout the entire seal. Such seals are manufactured by Chromerics of Woburn, Mass. 01888.

Figure 3:
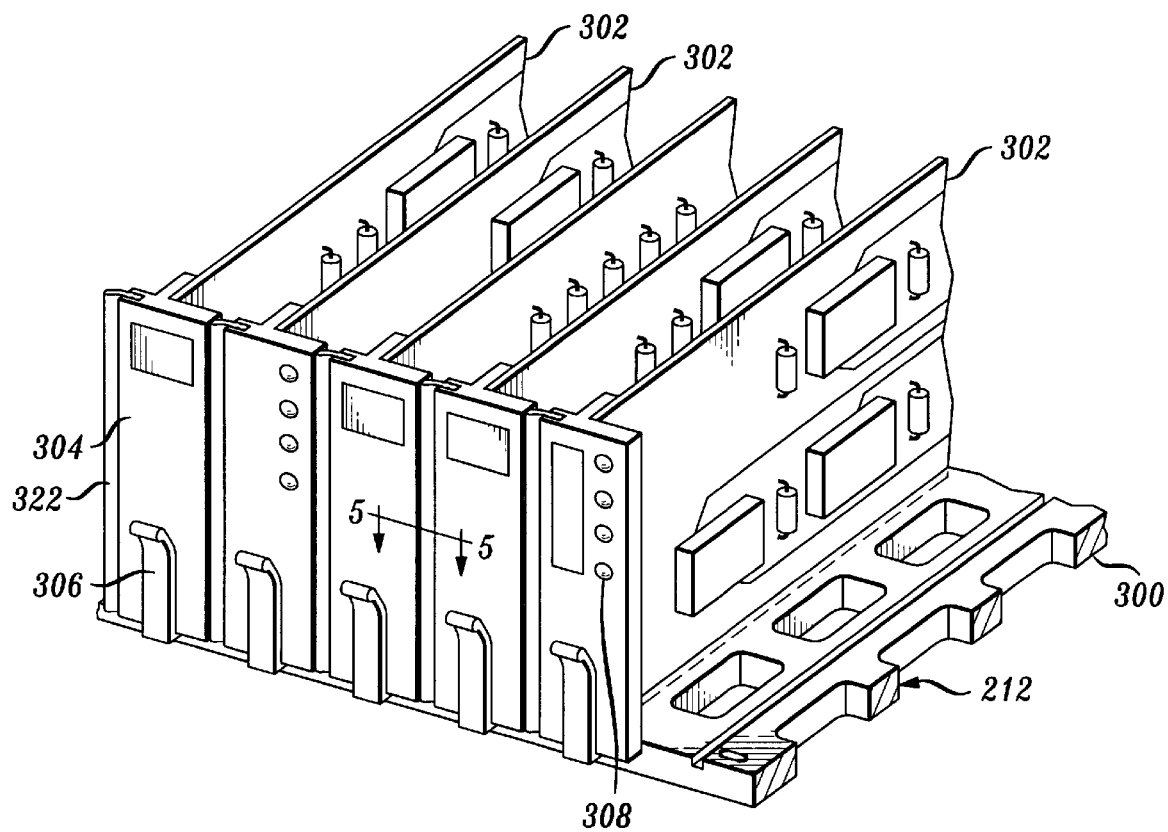
FIG. 3 is an illustration of a shelf of the frame of FIG. 2 employing an exemplary embodiment of this invention.

Turning now to FIG. 3, one shelf 212 of frame 200 is shown in detail. Each shelf comprises a rack 300 made of metal, as is known in the art. The rack is slotted to receive a lower edge of each circuit card. The rack also has openings or holes to facilitate air circulation. Each shelf holds a plurality of circuit cards 302 containing the components that provide system functionality. Attached to each circuit card is a face plate 304, or stiffener, to provide a brace for the circuit card and to hold the circuit card into the frame. Each face plate may include a clip 306 in order to hold the circuit card securely into the frame and may also include lights 308 or other indications which provide maintenance personnel with an indication of the functioning of the circuit card.

Each face plate is made of a conductive metal (or plastic with a conductive coating) in dimensions so that it conductively touches the rack on the top and bottom. Also, each face plate that mounts on the end of the shelf is sized to contact the sides, thus forming an electrically conductive surface.

According to this invention, a conductive, elastomeric seal 322 is positioned between each adjacent face plate. Seal 322 forms an air flow seal so that there is no air loss between face plates and is in contact with the two adjacent face plates thus providing electrical conductivity from one face plate to the next.

Figure 4:
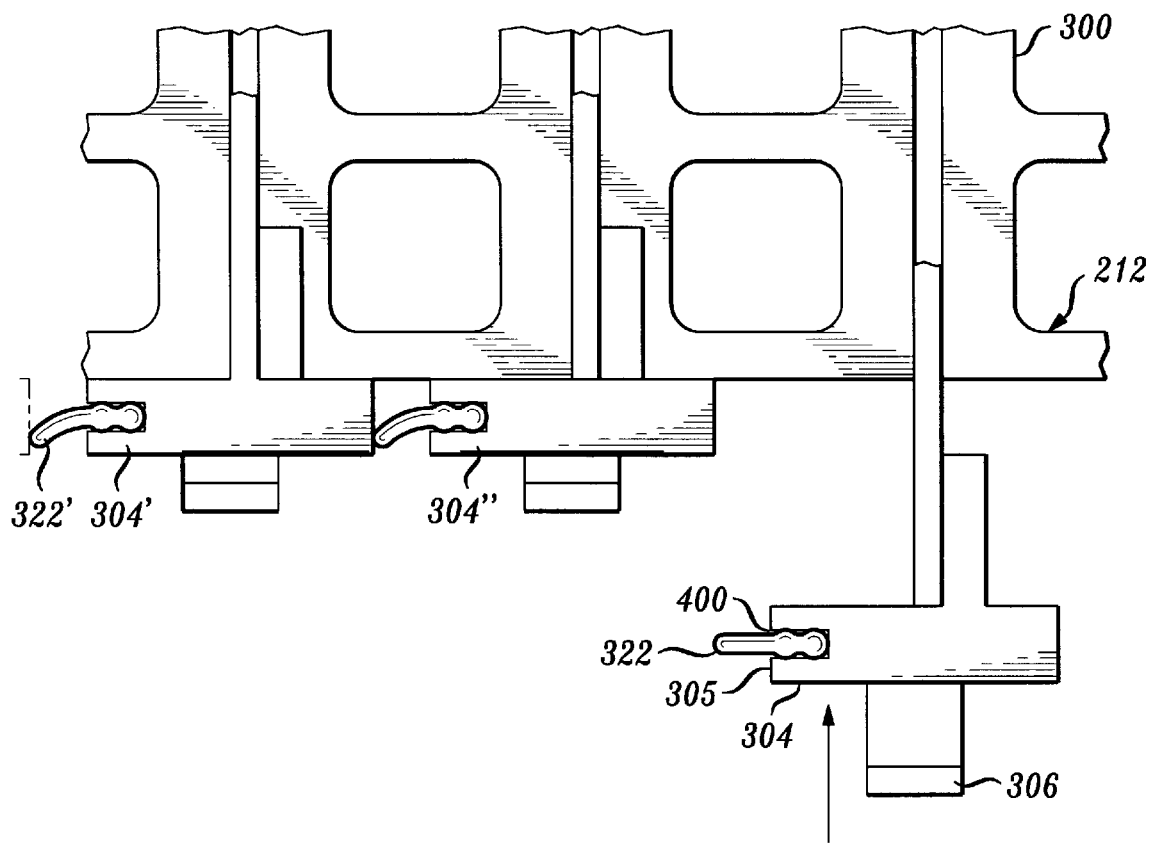
FIG. 4 is a top view of FIG. 3 illustrating interactions of an exemplary embodiment of this invention.

FIG. 4 illustrates a top view of the shelf of FIG. 3 with one face plate 304 and card pulled forward to illustrate an exemplary embodiment of this invention. Face plate 304, as stated above, comprises a conductive metal which has bare, unfinished surfaces at the edges in order to provide conductivity. According to the exemplary embodiment of this invention, a seal 322 comprising a conductive elastomeric material is mounted in a slot 400 or groove in one vertical edge 305 of face plate 304. Elastomeric seal 322 extends laterally from face plate and is long enough and flexible enough to make a sealing contact with the next adjacent face plate 304.

Seal 322 is formed in such a manner as to have a friction fit in slot 400 of face plate 304. As the circuit card is pushed in (or the next adjacent circuit card is pushed in) seal 322 comes in contact with the side of the next adjacent circuit card and flexes. The space between the circuit cards is thus filled up providing an air seal. When the conductive elastomeric material comes in contact with the next adjacent circuit card, it also provides an electrical connection providing EMC shielding. When the cards are inserted, their face plates, such as 304' and 304" are joined by the gaskets, such as 322' affixed to face plate 304'.

Figure 5:
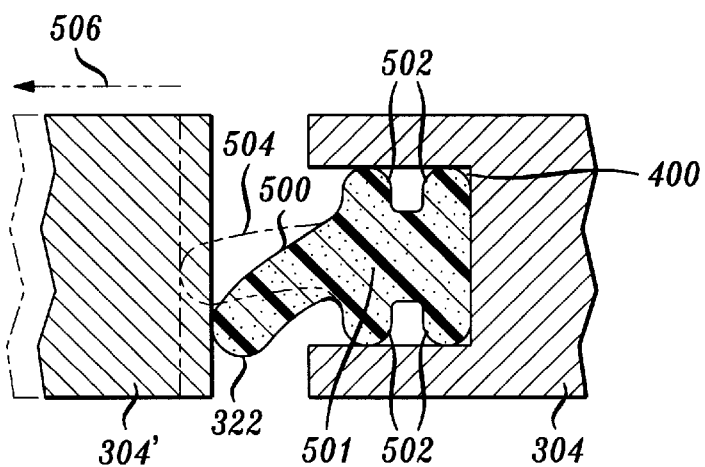
FIG. 5 is a top view and a cross sectional view of a seal of one embodiment of this invention.

FIG. 5 illustrates a cross-sectional view of an electrically conductive, elastomeric seal which provides both EMC protection as well as a thermal seal. This embodiment includes an elongated finger portion 500 connected to a base 501. A plurality of friction fit stubs 502, which retain seal 322 in slot 400, form a portion of base 501.

It has been found, however, that in certain applications, primarily applications involving multiple face plates in a full shelf of a frame for a switching system, that finger 500, as is shown in FIG. 5, does not flex fully. Finger 500 actually flexes less than is optimally desirable, more like that shown in phantom in 504. This lack of flexing tends to push the adjacent face plate 304' laterally, as shown by arrow 506. When used in certain low-density applications, i.e., a small shelf with very few cards, the configuration of FIGS. 4 and 5 is adequate, as the movement of adjacent cards can be tolerated by the shelf. However, as stated above, in large applications, this displacement of adjacent face plates has a cumulative effect and may cause misalignment of the cards when they are being installed in the shelf.

Figure 6:
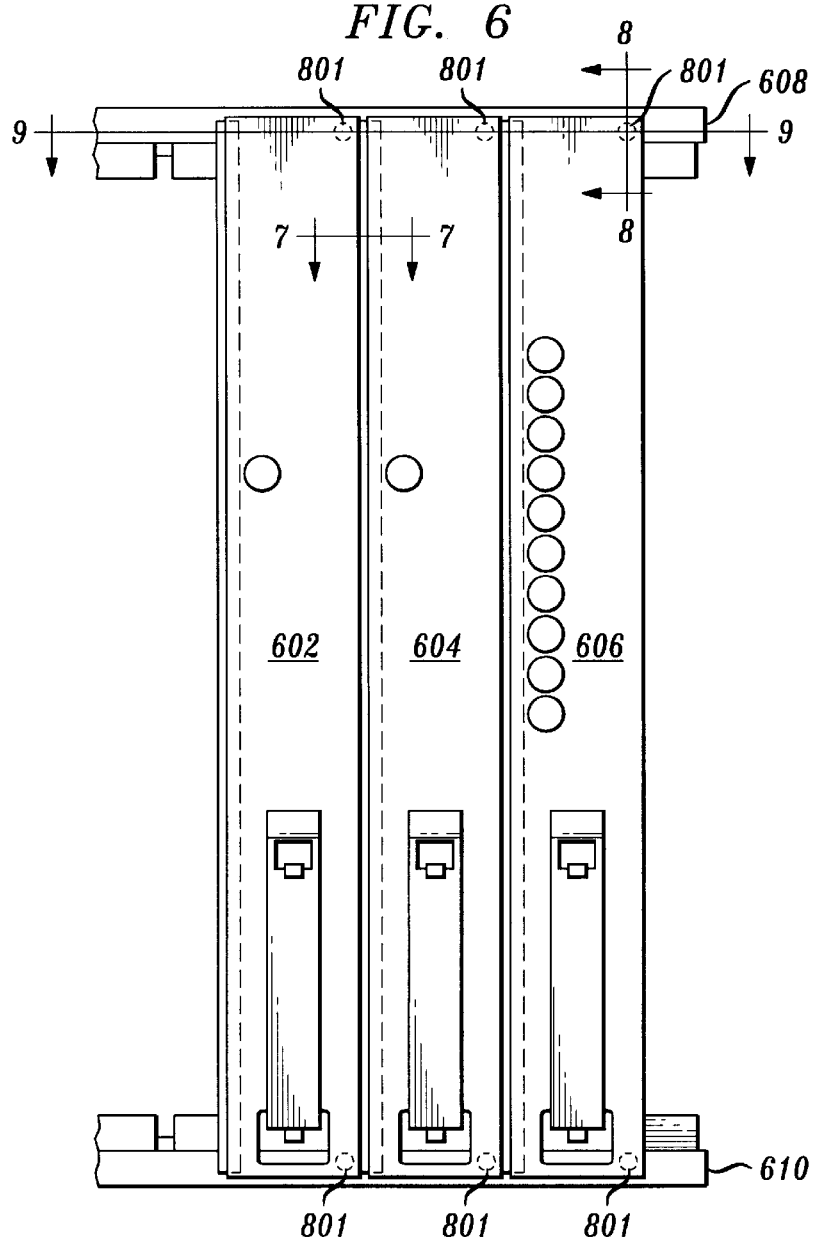
FIG. 6 is a front view of several circuit cards employing a further embodiment of this invention.

Turning now to FIG. 6, another exemplary embodiment of the present invention is illustrated. In this embodiment, the problem of having multiple face plates in a long frame becoming bulged or pushed out of alignment due to the previous embodiment is solved. In this example, three face plates 602, 604, and 606 are shown as well as an upper rack portion 608 and lower rack portion 610. In this exemplary embodiment, face plates 602, 604, and 606 remain in alignment regardless of how many face plates are on the shelf because of a seal design as shown in FIG. 7 (which is cross section 7—7 of FIG. 6), and pins as shown in FIG. 8.

Figure 7:
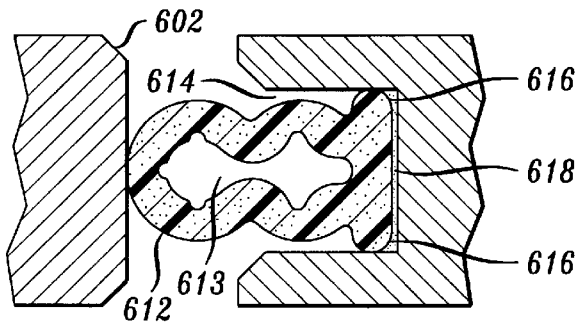
FIG. 7 is a cross-sectional view taken along lines 7—7 of FIG. 6 showing a further configuration of an electrically conductive elastomeric seal according to this invention.
Figure 8:
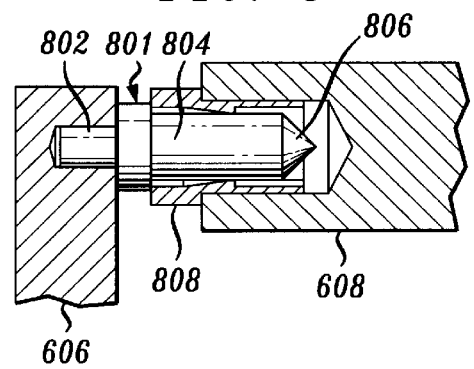
FIG. 8 shows a cross-sectional view of a pin taken along lines 8—8 of FIG. 6, according to this invention.

Turning now to FIG. 7, a cross section looking downwardly at adjoining face plates 602 and 604 is shown. The conductive, elastomeric seal 612 is shown mounted in slot 614. Seal 612 is in a modified figure-eight configuration with internal stress-concentrating areas so that it may compress more readily between face plates 602 and 604 but also remain in physical and electrical contact with face plates 602 and 604. Seal 612 includes a void 613 which allows seal 612 to compress more easily, and to provide an area for spring-like contact when seal 612 is compressed. Seal 612 may be held in place in slot 614 by means of lugs 616 that deform when the pressure of face plate insertion is applied to seal 612. Alternatively, or in addition, there may be an electrically conductive adhesive 618 holding seal 612 into place. FIG. 7 is shown before one of the face plates 602 and 604 is fully inserted. Once it is inserted, seal 612 deforms pushing the figure-eight outwardly, which also exerts pressure on adjacent face plate 602 and slot 614. Such pressure is desirable, because it provides a solid electrical contact and thermal conduction may thus also be controlled. However, such pressure, even though less than that of FIG. 5, may also force a shelf of face plates out of alignment.

To this end, a pin, such as pin 801 in FIG. 6, is pressed into each face plate, the pins mate with inserts 808 in rack 608 at the top of each face plate. Furthermore, there is also a pin 801 on the bottom of each face plate, and it fits into an insert 808 in bottom rack 610. The inserts 808 of top rack 608 and bottom rack 610 are permanently pressed into predrilled holes in the racks. Inserts 808 include an internal metallic spring which contacts the mating pins 801, thus providing a solid electrical contact at the top and bottom of face plates 602, 604, and 606.

Pin 801 generally comprises a stud 802, which is inserted into each of the face plates at the top and bottom. Pin 801 also includes a shaft 804 and a conical point 806. The conical point 806 is used for self centering purposes, as is known in the art, for ease of insertion. In addition to maintaining alignment, these pins 801 provide an additional electrical path to ground via springs of insert 808.

Figure 9:
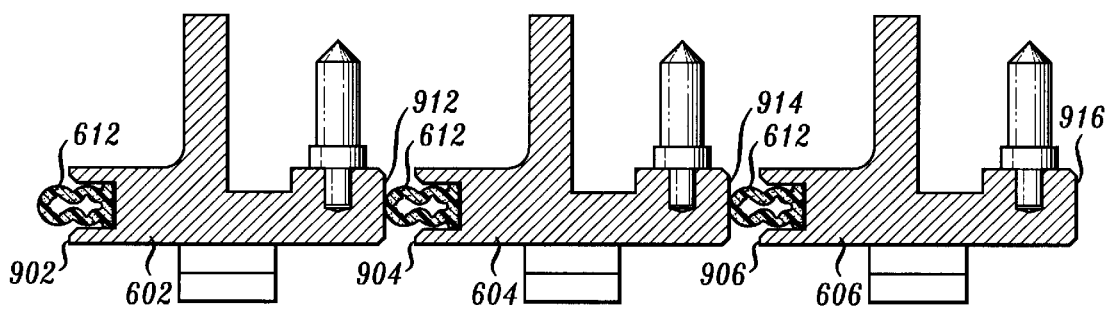
FIG. 9 shows a cross-sectional view taken along line 9—9 of FIG. 6 showing the relationship of the alignment pins to the seal.

FIG. 9 illustrates the cooperation of elements of this invention. This cross-sectional view, taken along 9—9 of FIG. 6, illustrates face plates 602, 604, and 606, having a first edge 902, 904, and 906, and a second edge 912, 914, and 916, opposite the first edge. Seals 612 are applied to first edges 902, 904, and 906, and pins 804 are connected to opposite edges 912, 914, and 916. In this manner, face plates 602, 604, and 606 may be thermally and electronically sealed by seal 612 and remain in alignment via pin 804.

By use of the electrically conductive elastomeric seal 612 and pin 801 any force exerted by seal 612 can be absorbed by the friction fit of pin 801 and, thus, all circuit cards will line up according to specification.

It is to be understood that the above-described embodiments are merely illustrative principles of the invention, and that many variations may be devised by those skilled in the art without departing from the scope of this invention. It is, therefore, intended that such variations be included within the scope of the claims.

The invention claimed is:

1. An apparatus for providing both electromagnetic compatibility protection and air circulation sealing for use between metallic face plates attached to circuit cards said apparatus comprising:

a plurality of electrically conductive face plates forming a front surface of an electronic equipment frame, said electronic equipment frame containing electronic equipment and having a plurality of racks for holding said circuit cards;

a seal comprising an electrically conductive, elastomeric material extending from a first surface of each of said face plates to contact an adjacent surface so that said seal forms an electrical conductivity and thermal seal between adjacent face plates, said seal having a first portion for contacting said first surface, a second portion for contacting said adjacent surface, and a third portion disposed therebetween, said third portion having an inner void whereby said seal compresses readily between said first and adjacent surfaces and remains in physical and electrical contact therewith; and one or more pins extending from said each of said face plates at respective locations displaced from said seal, each of said pins having a threadless portion thereof physically engaging a wall of one or more corresponding receptacles in said racks, whereby said face plates may be aligned in said frame.

2. An apparatus according to claim 1 wherein said one or more pins comprise two pins dispersed at a top corner and a bottom corner of each of said face plates on a surface adjacent said side, so that each of said face plates do not move laterally.

3. An apparatus according to claim 1 wherein said one or more pins provides a connection between said face plate and a ground plane of said frame.

4. An apparatus according to claim 1 wherein said seal cross-section comprises a modified figure eight, whereby said sides of said seal expand outwardly under pressure, and only a minimal amount of pressure is exerted laterally against adjacent face plates.

5. An apparatus according to claim 1 wherein said electrically conductive, elastomeric seal is impregnated with conductive particles.

6. An apparatus according to claim 1 wherein:

each said pin extends in a first direction;

each said pin functions to constrain said face plate from movement in directions perpendicular to said first direction; and each said pin contributes negligibly to constraining said face plate from movement in said first direction.

7. An apparatus according to claim 1 wherein each said pin functions to oppose forces presented by said seal in directions parallel to said face plate, whereby movement of said face plate in said directions is prevented.

8. An apparatus according to claim 1 wherein said one or more pins extend from said face plate at locations adjacent to a side of said face plate opposite said first side.

9. An apparatus for providing a thermal and electromagnetic conduction seal in a frame including a plurality of electrical circuit cards, said apparatus comprising:

a frame for supporting a plurality of circuit cards, said frame containing electronic equipment;

a plurality of face plates, each of said plurality of face plates being attached to one of said plurality of circuit cards;

each of said plurality of face plates being sealed to an adjacent one of said plurality of face plates by an elastomeric material impregnated with electrically conductive particles, thereby rendering said material electrically conductive, positioned so that said seal provides an electrically conductive seal between said face plate and an adjacent face plate;

said face plate having a plurality of edge surfaces, a first one of said plurality of edge surfaces being adjacent to another face plate and having said seal affixed thereto, and an adjacent one of said plurality of edge surfaces having a pin at a top portion of said face plate and a pin at a bottom portion of said face plate, said pins each having threadless portions physically engaging a wall of a receptacle in said frame in order to align said face plates in said frame;

said seal having an inner void intermediate said first edge surface and a distal end of said seal;

said frame including walls, top, bottom and back made of a thermal sealing material, so that said frames said face plates and said seals form an electromagnetic conduction seal and a thermal seal around said circuit cards.

10. An apparatus for providing both electromagnetic compatibility protection and air circulation sealing for use between metallic face plates attached to circuit cards, said apparatus comprising:

a plurality of electrically conductive face plates forming a front surface of an electronic equipment frame, said electronic equipment frame containing electronic equipment and having a plurality of racks for holding said circuit cards;

each of said plurality of face plates having an edge surface and at least one pin, each of said at least one pin having a threadless portion thereof physically engaging a wall of a corresponding receptacle in said racks;

a seal comprising an electrically conductive, elastomeric material extending from said edge surface of each said face plate in a direction parallel to such face plate to contact an adjacent surface, such contact being substantially confined to a distal end of said seal with respect to said edge surface, and said distal end in a final position being displaced substantially exclusively in a direction parallel to such face plate, so that said seal forms an electrical conductivity and thermal seal between adjacent face plates;

said seal having an inner void intermediate said edge surface and said distal end, whereby said seal compresses readily between said edge and adjacent surfaces and remains in physical and electrical contact therewith.

11. A face plate apparatus for providing an electromagnetic compatibility seal and a thermal seal for a front portion of an electronic equipment frame, said apparatus comprising:

an electronic equipment frame containing electronic equipment and having an opening for receiving at least one face plate;

a face plate and seal;

said face plate having an edge surface and at least one pin, each of said at least one pin having a threadless portion thereof physically engaging a wall of a corresponding receptacle in said frame;

a seal extending from said edge surface of said face plate in a direction parallel to said face plate to contact an adjacent surface, such contact being substantially confined to a distal end of said seal with respect to said edge surface, and said distal end in a final position being displaced substantially exclusively in a direction parallel to such face plate, said seal having an inner void intermediate said edge surface and said distal end whereby said seal compresses readily between said edge surface and adjacent surfaces and remains in physical and electrical contact therewith;

said seal being formed of an electrically conductive, elastomeric material so that said seal forms an air seal between said face plate and an adjacent face plate, and forms an electrical contact between said face plate and an adjacent face plate.

* * * * *